(12) United States Patent
Inoue et al.

(10) Patent No.: US 7,037,803 B2
(45) Date of Patent: May 2, 2006

(54) MANUFACTURE OF SEMICONDUCTOR DEVICE HAVING STI AND SEMICONDUCTOR DEVICE MANUFACTURED

(75) Inventors: Kengo Inoue, Kawasaki (JP); Toshifumi Mori, Kawasaki (JP); Ryou Nakamura, Kawasaki (JP); Hiroyuki Ohta, Kawasaki (JP); Takashi Saiki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/721,870

(22) Filed: Nov. 26, 2003

(65) Prior Publication Data
US 2004/0115897 A1  Jun. 17, 2004

(30) Foreign Application Priority Data
Nov. 29, 2002  (JP)  .............................. 2002-348641
Nov. 17, 2003  (JP)  .............................. 2003-387059

(51) Int. Cl.
*H01L 21/76*  (2006.01)

(52) U.S. Cl. ....................... 438/424; 438/695; 257/510

(58) Field of Classification Search ................ 438/424, 438/695, 700, 221; 257/510
See application file for complete search history.

(56) References Cited

U.S. PATENT DOCUMENTS

| | | | | |
|---|---|---|---|---|
| 4,877,641 A | * | 10/1989 | Dory | ........................... 427/574 |
| 4,877,651 A | * | 10/1989 | Dory | ...................... 427/255.18 |
| 5,447,884 A | | 9/1995 | Fahey et al. | |
| 5,874,368 A | * | 2/1999 | Laxman et al. | ............. 438/794 |
| 6,180,490 B1 | * | 1/2001 | Vassiliev et al. | ............. 438/424 |
| 6,180,493 B1 | * | 1/2001 | Chu | ........................... 438/437 |
| 6,258,695 B1 | * | 7/2001 | Dunn et al. | .................. 438/424 |
| 6,313,010 B1 | * | 11/2001 | Nag et al. | .................... 438/435 |
| 6,590,271 B1 | * | 7/2003 | Liu et al. | ..................... 257/510 |
| 2001/0041421 A1 | * | 11/2001 | Park et al. | .................... 438/424 |
| 2004/0171271 A1 | * | 9/2004 | Heo et al. | .................... 438/700 |

FOREIGN PATENT DOCUMENTS

| | | |
|---|---|---|
| JP | 10-56058 | 2/1998 |
| JP | 11-297811 | 10/1999 |
| JP | 2000-31261 | 1/2000 |
| JP | 2003-273206 | 9/2003 |

OTHER PUBLICATIONS

U.S. Appl. No. 10/283,128, filed Oct. 30, 2002, Ohta et al.
U.S. Appl. No. 10/721,080, filed Nov. 26, 2003, Ohta.
U.S. Appl. No. 10/283,128, filed on Oct. 30, 2002.

* cited by examiner

*Primary Examiner*—Caridad Everhart
(74) *Attorney, Agent, or Firm*—Westerman, Hattori, Daniels & Adrian, LLP

(57) ABSTRACT

A semiconductor device manufacture method has the steps of: (a) forming a polishing stopper layer over a semiconductor substrate; (b) etching the semiconductor substrate to form a trench; (c) forming a first liner insulating layer of silicon oxide over the surface of the trench; (d) forming a second liner insulating layer of silicon nitride over the first liner insulating layer, the second liner insulating layer having a thickness of at least 20 nm or at most 8 nm; (e1) depositing a third liner insulating layer of silicon oxide over the second liner insulating layer by plasma CVD at a first bias; and (e2) depositing an isolation layer of silicon oxide by plasma CVD at a second bias higher than the first bias, the isolation layer burying a recess defined by the third liner insulating layer.

33 Claims, 9 Drawing Sheets

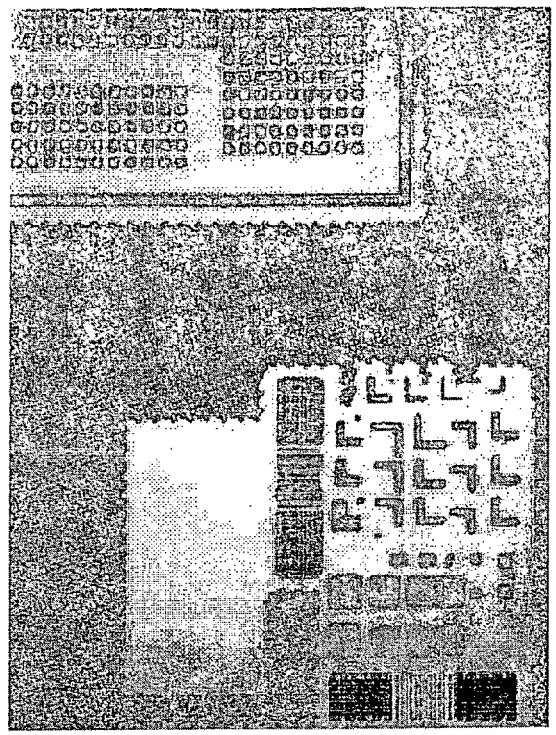
FIG.7B
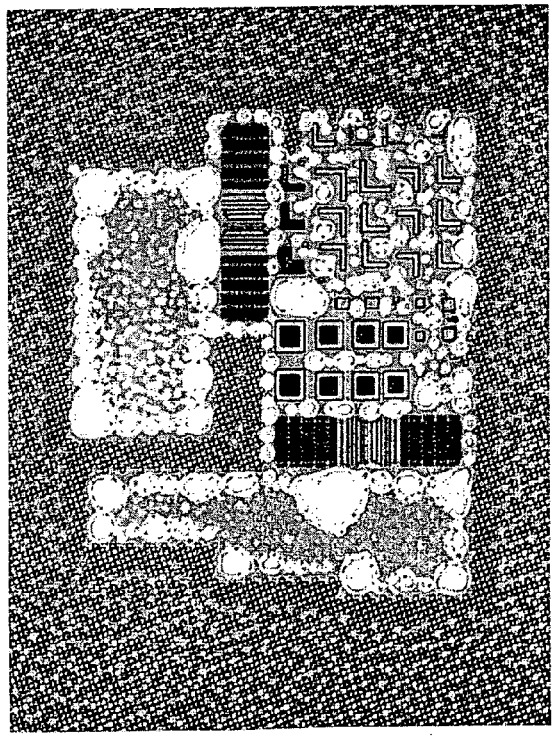
FIG.7A
| | 6nm | 8nm | 10nm | 12nm | 20nm |
|---|---|---|---|---|---|
| DCS-SiN | OK | NG | NG | NG | OK |
| BTN | OK | OK | OK | OK | OK |
FIG.7C

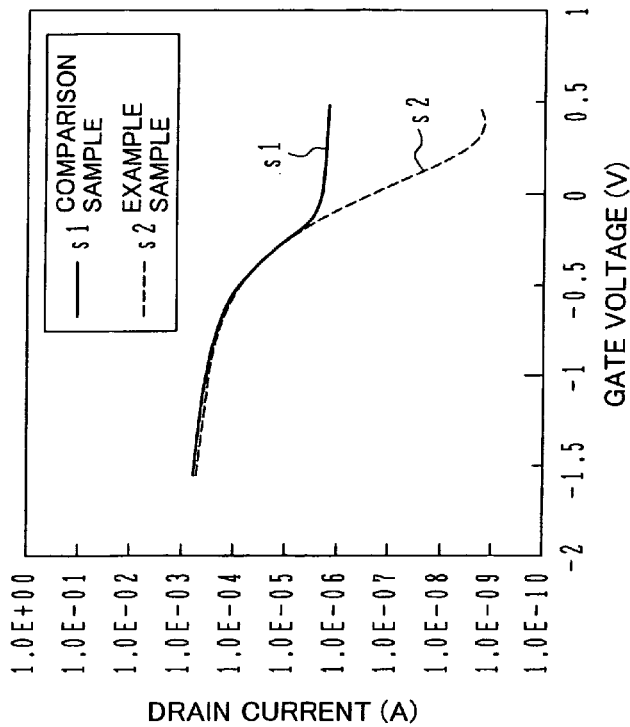
FIG.8C
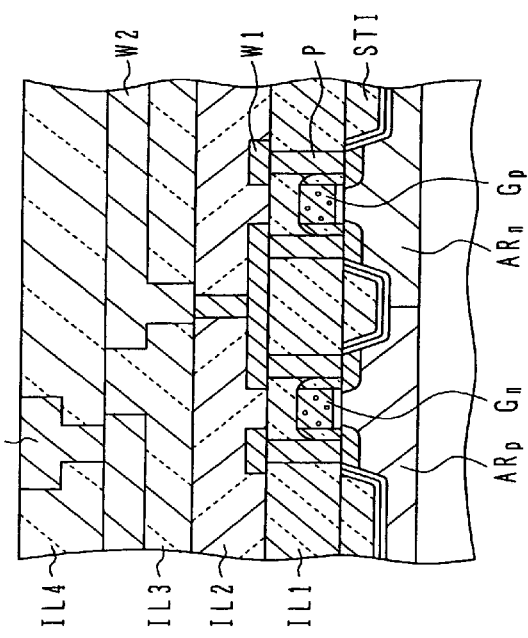
FIG.8A
FIG.8B

MANUFACTURE OF SEMICONDUCTOR DEVICE HAVING STI AND SEMICONDUCTOR DEVICE MANUFACTURED

CROSS REFERENCE TO RELATED APPLICATION

This application is based on and claims priority of Japanese Patent Applications No. 2002-348641 filed on Nov. 29, 2002, and No. 2003-387059 filed on Nov. 17, 2003, the entire contents of which are incorporated herein by reference.

BACKGROUND OF THE INVENTION

A) Field of the Invention

The present invention relates to a method of manufacturing a semiconductor device and a semiconductor device manufactured, and more particularly to a method of manufacturing a semiconductor device having shallow trench isolation (STI) and a semiconductor device manufactured thereby.

B) Description of the Related Art

Local oxidation of silicon (LOCOS) has been used as isolation of a semiconductor device.

According to LOCOS techniques, after a silicon oxide layer is formed on a silicon substrate as a buffer layer, a silicon nitride layer is formed. After the silicon nitride layer serving as an oxidation preventive mask layer is patterned, the surface of the silicon substrate is thermally oxidized.

Oxidizing species such as oxygen and moisture enter the buffer silicon oxide layer when the silicon substrate is thermally oxidized. These oxidizing species oxidize also the silicon substrate surface under the edge of the silicon nitride layer through the buffer oxide layer and silicon oxide regions called birds' beaks are formed. Although the bird's beak region is outside the isolation region, this bird's beak region cannot be used as an active region for forming electronic elements so that the area of the active region is reduced.

A silicon nitride layer having apertures of various sizes is formed on a silicon substrate and the substrate surface is thermally oxidized. A silicon oxide layer formed on the silicon substrate surface in a small size aperture is thinner than a silicon oxide layer formed on the silicon substrate surface in a large size aperture. This phenomenon is called thinning.

As a semiconductor device becomes miniaturized, a ratio of an area not used as the electronic element forming region to a total area of a semiconductor substrate increases. Namely, a ratio of narrowing the electronic element forming region increases, hindering high integration of a semiconductor device.

Trench isolation (TI) techniques are known as isolation region forming techniques. According to TI techniques, a trench is formed in the surface layer of a semiconductor substrate and insulator or polysilicon is filled or buried in the trench. This method has been used for forming a bipolar transistor LSI which requires deep isolation regions.

Trench isolation is being applied to a MOS transistor LSI in order to eliminate both bird's beak and thinning. MOS transistor LSI's do not require deep isolation regions like bipolar transistor LSI's and can use relatively shallow isolation regions having a depth of about 0.1 to 1.0 μm, which is called shallow trench isolation (STI).

According to a proposed STI forming method, after a trench is formed, a liner layer made of a silicon oxide layer and a silicon nitride layer is formed and a filling or burying silicon oxide layer is formed on the liner layer.

Reference is made to Japanese Patent Laid-open publication Nos. HEI-11-297811 and 2000-31261, U.S. Pat. No. 5,447,884, which is incorporated herein by reference, and Japanese Patent Laid-open Publication Nos. HEI-10-56058 and 2003-273206 corresponding to U.S. patent application Ser. No. 10/283,128 filed on Oct. 30, 2002, which is incorporated herein by reference.

STI is fitted for miniaturization, but there may arise other problems unique to STI. Novel techniques for solving problems unique to STI are being desired.

SUMMARY OF THE INVENTION

An object of this invention is to provide a method of manufacturing a semiconductor device having STI of good burying characteristics.

Another object of the invention is to provide a method of manufacturing a semiconductor device having STI of good burying characteristics and causing less peeling or tear-off.

Further object of the invention is to provide a semiconductor device having high reliability and superior characteristics, and a manufacture method therefor.

According to one aspect of the present invention, there is provided a method of manufacturing a semiconductor device comprising the steps of: (a) forming a polishing stopper layer on a surface of a silicon substrate, the stopper layer including a silicon oxide layer and a silicon nitride layer; (b) etching the stopper layer and the silicon substrate by using a mask to form a trench; (c) forming a first liner insulating layer of silicon oxide on a surface of the silicon substrate exposed in the trench; (d) forming a second liner insulating layer of silicon nitride on the first liner insulating layer, the second liner insulating layer having a thickness of 20 nm or thicker; (e) depositing an isolation layer of silicon oxide by plasma CVD, the isolation layer burying a recess defined by the second liner insulating layer; (f) polishing and removing an unnecessary region of the isolation layer by using the stopper layer as a polishing stopper; and (g) etching the stopper layer.

According to another aspect of the present invention, there is provided a method of manufacturing a semiconductor device comprising the steps of: (a) forming a polishing stopper layer on a surface of a silicon substrate, the stopper layer including a silicon oxide layer and a silicon nitride layer; (b) etching the stopper layer and the silicon substrate by using a mask to form a trench; (c) forming a first liner insulating layer of silicon oxide on a surface of the silicon substrate exposed in the trench; (d) forming a second liner insulating layer of silicon nitride on the first liner insulating layer, the second liner insulating layer having a thickness of 8 nm or thinner; (e1) depositing a third liner insulating layer of silicon oxide on the second liner insulating layer by plasma CVD at a first bias; (e2) depositing an isolation layer of silicon oxide by plasma CVD at a second bias higher than the first bias, the isolation layer burying a recess defined by the third liner insulating layer; (f) polishing and removing an unnecessary region of the isolation layer by using the stopper layer as a polishing stopper; and (g) etching the stopper layer.

According to still another aspect of the present invention, there is provided a method of manufacturing a semiconductor device comprising the steps of: (a) forming a polishing stopper layer on a surface of a silicon substrate, the stopper layer including a silicon oxide layer and a silicon nitride layer; (b) etching the stopper layer and the silicon substrate by using a mask to form a trench; (c) forming a first liner insulating layer of silicon oxide and a second liner insulating layer of silicon nitride on a surface of the silicon substrate exposed in the trench; (d) forming a third liner insulating layer of silicon oxide on the second liner insulating layer by plasma CVD at a first bias; (e) depositing an isolation layer of silicon oxide by high density plasma CVD at a second bias higher than the first bias, the isolation layer burying a recess defined by the third liner insulating layer; (f) polishing and removing an unnecessary region of the isolation layer by using the stopper layer as a polishing stopper; and (g) etching the stopper layer.

According to further aspect of the invention, there is provided a method of manufacturing a semiconductor device comprising the steps of: (a) forming a polishing stopper layer on a surface of a silicon substrate, said stopper layer including a silicon oxide layer and a silicon nitride layer; (b) etching said stopper layer and said silicon substrate by using a mask to form a trench; (c) forming a first liner insulating layer of silicon oxide on a surface of said silicon substrate exposed in said trench; (d) forming a second liner insulating layer of carbon-containing silicon nitride on said first liner insulating layer; (e) depositing an isolation layer of silicon oxide by plasma CVD, said isolation layer burying a recess defined by said second liner insulating layer; (f) polishing and removing an unnecessary region of said isolation layer by using said stopper layer as a polishing stopper; and (g) etching said stopper layer.

According to still further aspect of the invention, there is provided a semiconductor device comprising: a silicon substrate;

a trench formed in said silicon substrate, and defining active regions; a first liner layer of silicon oxide covering surface of each said trench; a second liner layer of carbon-containing silicon nitride formed on said first liner layer; an isolation region of silicon oxide formed on said second liner layer and filling said trench; and a p-channel MOS transistor formed in one of said active regions.

With such a configuration, the manufacture method of a semiconductor device having STI causing less tear-off is provided.

BRIEF DESCRIPTION OF THE DRAWINGS

FIGS. 7A and 7B are photographs of samples according to comparison example and the further embodiment, and FIG. 7C is a table showing the experimental results.

FIGS. 8A and 8B are a plan and a cross-sectional views of a sample, and FIG. 8C is a graph showing the drain current vs. gate voltage characteristics of samples according to comparison example and the further embodiment.

DESCRIPTION OF THE PREFERRED EMBODIMENTS

Prior to describing the embodiments of the invention, the results of researches made by the present inventors will be described. A variety of trench widths are used for STI. In order to stably bury a narrow width trench, it is effective to use a film deposition method which causes a concurrent progress of deposition and etching (sputtering). A high density plasma CVD is used for such a purpose.

High density plasma has a plasma density higher than that of diode parallel plate plasma. An example is high density plasma generated by inductive coupling. In this specification, high density plasma CVD is intended to mean a CVD process of using film forming source gas and gas such as Ar, He and $H_2$ which does not contribute to a film forming function but provides sputtering function, generating high density plasma, and forming a film while sputtering is performed. Since protruded regions are preferentially worn off or scraped by sputtering, a film can be formed in a recess, while preventing voids. A film forming speed is ensured by using high density plasma.

Figure 3A:
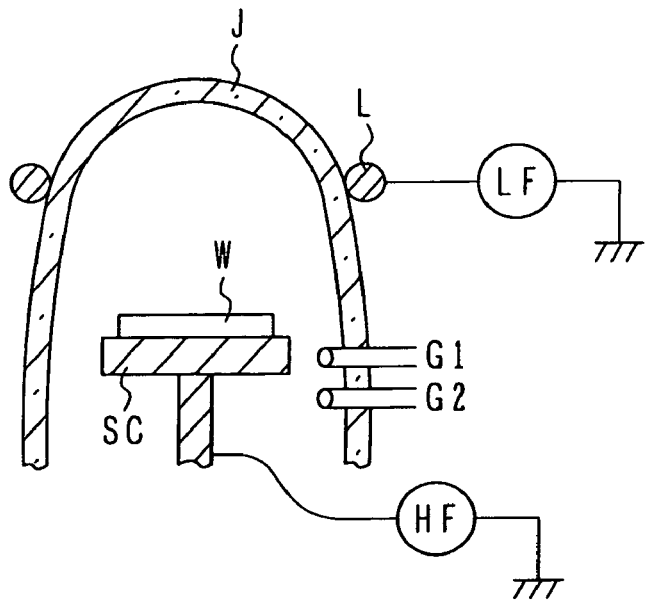
FIGS. 3A and 3B are cross sectional views showing an example of the structure of a plasma CVD system.

FIG. 3A shows an example of the structure of a high density plasma CVD system. A coil L is disposed around a bell jar (chamber) J made of material such as glass through which radio waves can pass. The coil L is connected to a relatively low, high frequency power source LF at 400 kHz for example. A susceptor SC serving also as an electrode is disposed in the chamber J. A wafer W to be processed is placed on the susceptor SC. The susceptor SC is connected to a relatively high, high frequency power source HF at 13.56 MHz for example. The high frequency power source HF is used for supplying a high frequency bias power. Frequency of the relatively high, high frequency power source HF is higher than that of the relatively low, high frequency power source LF.

CVD gas is introduced from a gas inlet port G1 and sputtering gas is introduced from a gas inlet port G2. Alternatively, mixed gas may be introduced. An LF power supplied through the coil generates plasma and an HF power applied to the susceptor generates a bias field for directing charged particles in the plasma toward the wafer W.

Figure 3B:
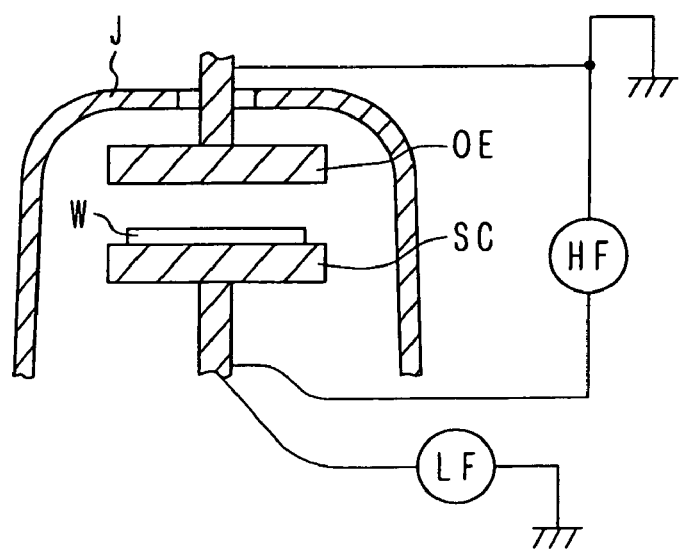

FIG. 3B shows an example of a diode parallel plate plasma CVD system as compared to the high density plasma CVD. A susceptor SC as one electrode and an opposing electrode OE are disposed in parallel facing each other in a chamber J. A wafer W is placed on the susceptor SC. A high frequency power source HF at 13.56 MHz for example is connected between the opposing electrodes OE and SC. The susceptor electrode SC is often connected also to another high frequency power source LF at 400 kHz for example.

In the high density plasma CVD system shown in FIG. 3A, induction by the coil L generates high density plasma in the chamber J. In the diode parallel plate plasma CVD system shown in FIG. 3B, plasma is generated in a space between the opposing electrodes capacitively coupled. Inductive coupling is suitable for generating high density plasma more than capacitive coupling. STI can be buried reliably by using high density plasma CVD which provides a concurrent progress of both deposition and sputtering.

STI for a high integration semiconductor device was formed by using a silicon oxide liner layer, a silicon nitride liner layer and a filling silicon oxide layer formed by high density plasma CVD.

Figure 4:
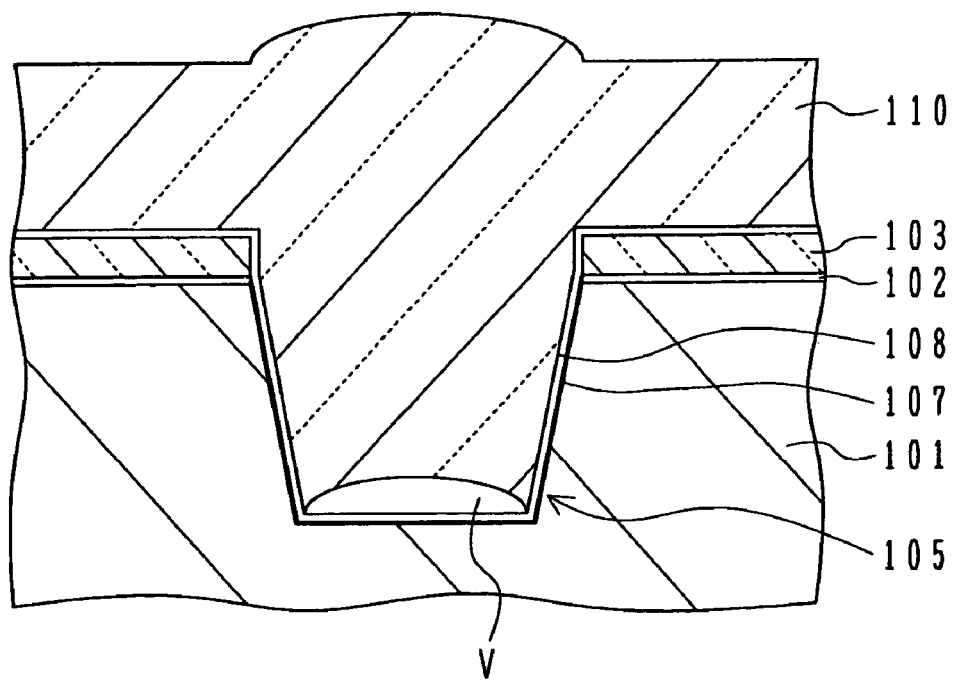
FIG. 4 is a schematic cross sectional view of STI which caused tear-off.

FIG. 4 shows the structure of a sample of STI. On the surface of a silicon substrate 101, a silicon oxide layer 102 about 10 nm thick is formed by thermal oxidation. On this silicon oxide layer 102, a silicon nitride layer 103 about 110 nm thick is formed by low pressure (LP) CVD. A resist pattern is formed on the silicon nitride layer 103, and the silicon nitride layer 103 and silicon oxide layer 102 are etched to form a hard mask. By using the hard mask as an etching mask, the silicon substrate 100 is etched by about 300 nm from its surface to form a trench 105.

The silicon surface exposed on the surface of the trench 105 is thermally oxidized to form a liner layer 107 of silicon oxide having a thickness of about 5 nm and recovering the layer damaged by etching. A liner layer 108 of silicon nitride is formed to a thickness of about 10 nm by LPCVD, covering the silicon oxide layer 107 and silicon nitride layer 103. On this liner layer 108, a filling silicon oxide layer 110 having a thickness of about 500 nm is deposited by high density plasma (HDP) CVD.

As shown in FIG. 4, a void V is formed due to tear-off between the silicon nitride liner layer 108 and HDPCVD silicon oxide layer 110. Almost all samples formed by the above-described processes have tear-off. This void indicates a poor adhesion between the silicon nitride liner layer 108 and HDPCVD silicon oxide layer 110 and suggests a possibility of extended tear-off. If impurities or the like enter the void at the tear-off, they are difficult to be removed.

The present inventors made various trials in order to find processes free of tear-off. The silicon nitride liner layer has many noteworthy characteristics such as a thermal expansion coefficient greatly different from that of silicon and silicon oxide, a large stress, and a hydrophobic surface. The influence of a thickness of a silicon nitride liner layer was studied. It has been found from the results of the researches that no tear-off occurs if the thickness of the silicon nitride liner layer is set to 20 nm or thicker.

With reference to FIGS. 1A to 1H, description will be given on a semiconductor manufacture method according to a first embodiment of the invention.

Figure 1A:
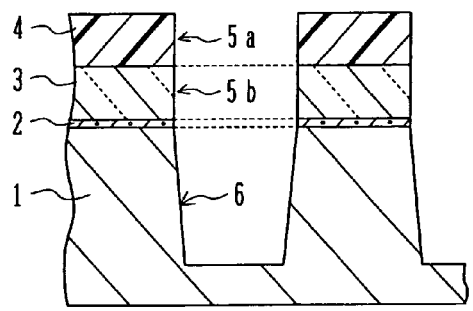
FIGS. 1A to 1H are cross sectional views illustrating a semiconductor device manufacture method according to an embodiment of the invention.

As shown in FIG. 1A, on the surface of a silicon substrate 1, a silicon oxide layer 2 is formed by thermal oxidation to a thickness of 9 to 21 nm, e.g., 10 nm. On this silicon oxide layer 2, a silicon nitride layer 3 is formed by low pressure (LP) chemical vapor deposition (CVD) to a thickness of 100 to 150 nm, e.g., 110 nm. LPCVD is performed under the conditions of, for example, source gases of $SiCl_2$ and $NH_3$ and a temperature of 750° C. to 800° C. Since the silicon nitride layer is relatively thick, the film forming temperature is set relatively high to increase the film forming speed.

On the silicon nitride layer 3, a resist layer is coated, exposed and developed to form a resist pattern 4. The resist pattern 4 is formed on the active region (electronic elements forming region) and an aperture of the resist pattern defines the isolation region. A width of the aperture 5a is 0.1 to 1 μm for example.

By using the resist pattern 4 as an etching mask, the silicon nitride layer 3 and silicon oxide layer 2 are etched. The resist mask 4 may be removed at this time. By using the silicon nitride layer 3 as an etching mask, the silicon substrate 1 is anisotropically etched by reactive ion etching (RIE). The silicon substrate 1 is etched by a depth of, for example, 300 nm to form a trench 6. The silicon nitride layer and silicon oxide layer are etched by using as etching gas mixed gas of $CF_4$, $CHF_3$ and Ar. The silicon substrate 1 is etched by using as etching gas mixed gas of HBr and $O_2$ or mixed gas of $Cl_2$ and $O_2$. If the resist pattern exists, it is removed at this time.

Figure 1C:
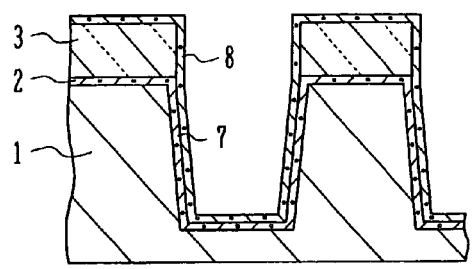
Figure 1B:
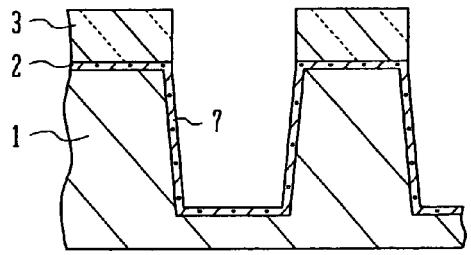

As shown in FIG. 1B, the silicon substrate surface exposed on the surface of the trench 6 is thermally oxidized to form a silicon oxide liner layer 7 having a thickness of 3 nm for example. The whole silicon surface exposed in the trench 6 is therefore covered with the silicon oxide liner layer 7. The silicon oxide layer 7 may be further nitridated to form oxynitride.

As shown in FIG. 1C, a silicon nitride liner layer 8 is formed by LPCVD, covering the silicon oxide liner layer 7 and silicon nitride layer 3. A thickness of the silicon nitride liner layer 8 is 20 nm for example. LPCVD is performed under the conditions of, for example, mixed source gas of $SiCl_2H_2$ and $NH_3$ and a temperature lower than 680° C., e.g., abut 650° C. Since the thickness of the silicon nitride liner layer is relatively thin, the film forming temperature is set relatively low to reduce the film forming speed. A silicon nitride liner layer having a thickness of 20 nm or thicker is very hard to be torn off after a later STI burying process.

Source gas may be: silane ($SiH_4$) and ammonia ($NH_3$); tetrachlorosilane ($SiCl_4$) and ammonia; bis-tertial butylaminosilane (BTBAS) and ammonia; or the like. The silicon nitride liner layer is formed in such a manner that it has a tensile stress of 1.2 GPa or larger. This stress has a direction opposite to that of the stress of a burying silicon oxide layer subjected to a thermal process of making the silicon oxide layer dense as will be later described.

After the silicon nitride liner layer 8 is formed, a thermal process at 1000° C. to 1150° C. may be performed by rapid thermal annealing (RTA) or the like. For example, if a thermal process at 1000 ° C. is performed for 30 seconds in an $N_2$ atmosphere, the tensile stress of the silicon nitride liner layer can be increased by 20 to 30%.

Figure 1D:
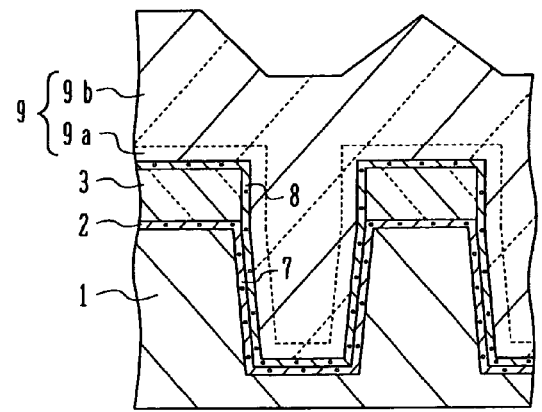

As shown in FIG. 1D, the substrate formed with the silicon nitride liner layer 8 is subjected to pre-annealing at 400° C. to 450° C. for 1 to 5 minutes in the chamber of a high density plasma (HDP) CVD system. In succession, a silicon oxide layer 9 is formed in the same chamber by HDPCVD to bury the trench. For example, if a trench having a depth of 300 nm is formed, the thickness of the burying silicon oxide layer 9 is set to about 500 nm on the flat surface.

The silicon oxide layer is formed by using as source gas mixed gas of $SiH_4$ and oxygen or mixed gas of TEOS and ozone. After the silicon oxide layer 9 is grown, annealing is performed at about 1000° C. to make dense the silicon oxide layer 9. The quality of the silicon oxide layer 9 in the trench after a process of making dense the silicon oxide layer is generally the same as the quality of the thermally oxidized layer. Although the dense silicon oxide layer has a compressive stress, this compressive stress has a direction opposite to that of the tensile stress of the silicon nitride liner layer. The compressive stress is cancelled out by the tensile stress. Reduction of the carrier mobility by the compressive stress can be suppressed by the tensile stress.

Figure 1E:
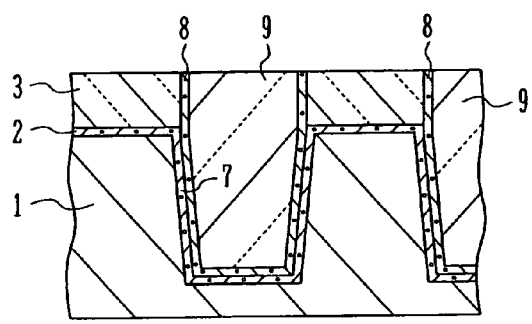

As shown in FIG. 1E, chemical mechanical polishing (CMP) is performed to remove an unnecessary region of the silicon oxide layer 9 above the surface of the silicon nitride layers 3 and 8. CMP is performed by squeezing the silicon substrate between rotating upper and lower surface plates. For example, the rotating speed of the upper and lower surface plates is set to 20 rpm, a pressure between the upper and lower surface plates is set to 5 psi, a back pressure is set to 5 psi, and slurry having as its main composition colloidal silica or slurry which contains cerium oxide is used as polishing agent.

Under such polishing conditions, an etching rate of the silicon nitride layer 3 is small so that the silicon nitride layer 3 functions as a stopper of polishing. In the state after polishing, the surface of the silicon oxide layer 9 is almost flush with the surface of the silicon nitride layer 3. The silicon oxide layer 9 is left only in the aperture defined by the silicon nitride layer 3. Although the silicon oxide layer 9 on the silicon nitride layer 3 is removed by CMP, it may be removed by RIE using mixed gas of $CF_4$ and $CHF_3$.

Figure 1G:
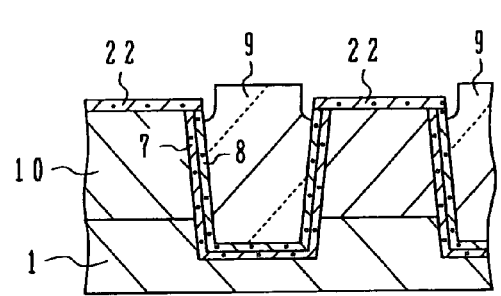
Figure 1F:
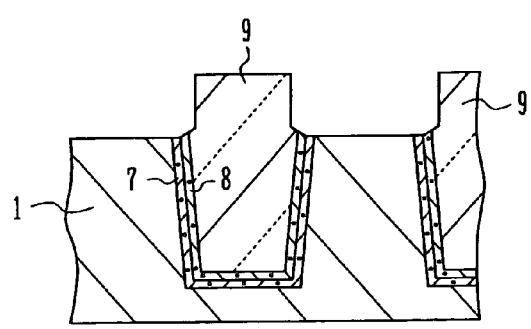

As shown in FIG. 1F, the silicon nitride layer 3 is etched by hot phosphoric acid. The silicon nitride layer 8 on the side walls of the silicon nitride layer 3 is also etched at this time. Thereafter, the silicon oxide layer 2 on the surface of the silicon substrate 1 is removed by dilute hydrofluoric acid.

As shown in FIG. 1G, the surface of the silicon substrate 1 is thermally oxidized to grow a sacrificial oxide layer 22.

By using the sacrificial oxide layer 22 as a through oxide layer, ions are implanted into the surface layers of the silicon substrate 1 and the implanted impurity ions are activated to form a well 10 having a predetermined conductivity type. For example, n- and p-type wells are formed by different processes of ion implantation using resist masks. After the well 10 is formed, the sacrificial oxide layer is removed by dilute hydrofluoric acid.

Figure 1H:
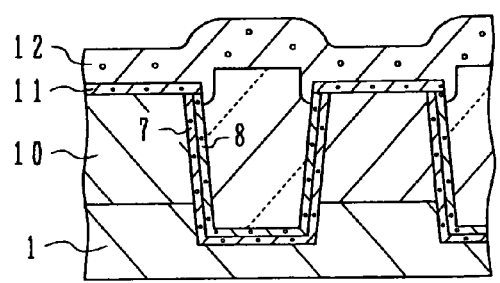

As shown in FIG. 1H, the surface of the silicon substrate 1 exposed by removing the sacrificial oxide layer is thermally oxidized to form a gate insulating layer 11 having a thickness of 2 nm for example. Prior to forming the gate oxide layer 11, the thermally oxidized layer is etched by an etching which can etch about 20 nm thick oxide, using dilute hydrofluoric acid. A polysilicon layer 12 is formed on the gate oxide layer 11.

The polysilicon layer 12 and gate oxide layer 11 are patterned to form a gate electrode. Impurity ions of the conductivity type opposite to that of the well 10 are implanted into the regions on both sides of the gate electrode to form at least part of source/drain regions. If necessary, side wall spacers are formed on the side walls of the gate electrode, and impurity ions are implanted and activated to form high impurity concentration source/drain regions.

Figure 2A:
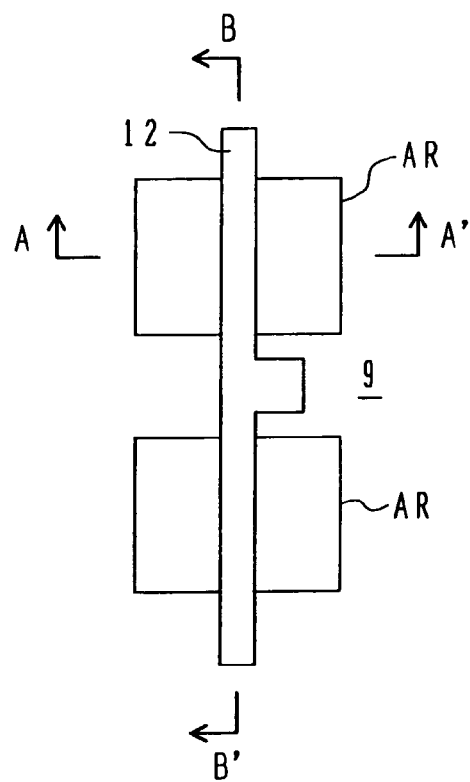
FIGS. 2A and 2B are a plan view and a cross sectional view of a semiconductor device manufactured by the embodiment method illustrated in FIGS. 1A to 1H.

FIG. 2A is a plan view showing the shapes of active regions AR defined by an isolation region 9 and a gate electrode 12 formed on the surface of a silicon substrate. FIGS. 1A to 1H correspond to cross sectional views taken along line B–B'. Each active region AR is surrounded by the isolation region 9. Two active regions are used to form a CMOS inverter.

FIG. 2A shows the state before the side wall spacers are formed. After the side wall spacers are formed, impurity ions of the conductivity type opposite to that of the well are implanted to form high impurity concentration regions.

Figure 2B:
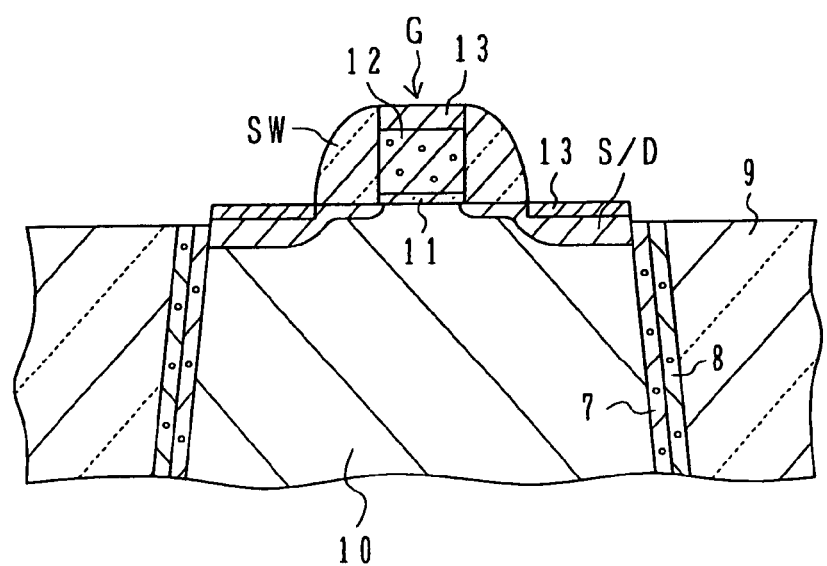

FIG. 2B is a cross sectional view taken along line A–A' shown in FIG. 2A. Side wall spacers SW are formed on the side walls of the gate electrode and the deep, highly doped source/drain regions S/D are formed in the regions on both sides of the gate electrode. A silicide layer 13 is formed on the gate electrode 12 and source/drain regions S/D.

Since the silicon nitride liner layer 8 having a thickness of 20 nm or thicker is formed between the thermally oxidized silicon oxide liner layer 7 and the HDPCVD silicon oxide burying layer 9, STI eliminating tear-off and having the excellent burying characteristics can be formed.

If the width of STI is narrow, e.g., 0.1 μm, and the silicon nitride liner layer having a thickness of 20 nm or thicker is formed, the width of the remaining trench becomes too narrow, which may cause some trouble in a later process. In order to avoid this, the inventors have sought an approach to preventing tear-off even if a thin silicon nitride liner layer is formed.

During the process of burying a silicon oxide layer through HDPCVD, the surface of the silicon nitride liner layer 8 is exposed to impacts of high energy ions and heated by plasma. It can be considered that the silicon nitride liner layer 8 is damaged and degassed. In order to prevent such a phenomenon, one approach is to lower the bias at the initial stage of the silicon oxide layer burying process. As the bias is lowered, the energy of incident particles lowers so that it can be expected that heat and impact applied to the silicon nitride liner layer are reduced.

It has been found that tear-off can be suppressed efficiently by turning off the bias power of HDPCVD and depositing the silicon oxide layer with no bias at the initial deposition stage. Tear-off rarely occurs if the thickness of the silicon nitride liner layer is set to 8 nm or thinner.

A second embodiment of the invention will be described.

The processes shown in FIGS. 1A and 1B are performed in the manner similar to the first embodiment.

In the process shown in FIG. 1C, a silicon nitride liner layer 8 having a thickness of 8 nm or thinner is formed by LPCVD. For example, a silicon nitride liner layer 8 having a thickness of about 8 nm is deposited by LPCVD. This process excepting the thickness is similar to that of the first embodiment.

In the process shown in FIG. 1D, after pre-heating at 400° C. to 450° C. for 1 to 5 minutes, the silicon oxide layer 9 is formed at two steps.

First, a supply of a bias power to the susceptor electrode is shut down to form a silicon oxide layer 9a without supplying a bias power. For example, the source gas flow rate is about 120 sccm for silane, about 160 sccm for oxygen, about 500 sccm for helium, a source RF power is 3200 W and a bias HF power is about 0 W. In this manner, the silicon oxide liner layer 9a having a thickness of about 2 nm is formed on the silicon nitride layer 8.

The wafer temperature was 400° C. during HDPCVD without bias power, and the wafer temperature was 650° C. when a bias power was applied. It can be considered that the pre-heating at 400° C. to 450° C. degasses the wafer in advance the formation of the silicon nitride liner layer. Even if the wafer is heated thereafter to 400° C. during no bias HDPCVD, it can be considered that the degassing from the wafer hardly occurs.

Thereafter, the bias HF power is increased to about 2000 W to deposit an additional silicon oxide layer 9b. Since the silicon oxide liner layer 9a is already formed on the silicon nitride liner layer 8, even if there is an impact of high energy particles, the silicon nitride liner layer is less influenced. Thereafter, the processes shown in FIGS. 1E to 1H are performed in the manner similar to the first embodiment.

Simple tests were conducted in order to confirm the effects of the second embodiment. A silicon nitride layer having a thickness of about 8 nm was formed on an Si substrate, and a high density plasma silicon oxide layer having a thickness of about 500 nm was formed on the silicon nitride layer. A first sample was formed by the following processes. In forming the high density plasma silicon oxide layer, first a silicon oxide layer having a thickness of about 2 nm was formed without bias, and thereafter a high density plasma silicon oxide layer having a thickness of about 500 nm was formed by applying a high bias power (2100 W).

A second sample for comparison was formed by the following process. Without forming a no-bias high density silicon oxide layer, a high bias (2100 W) high density plasma silicon oxide layer was formed to a thickness of about 500 nm directly on the silicon nitride layer.

Figure 5A:
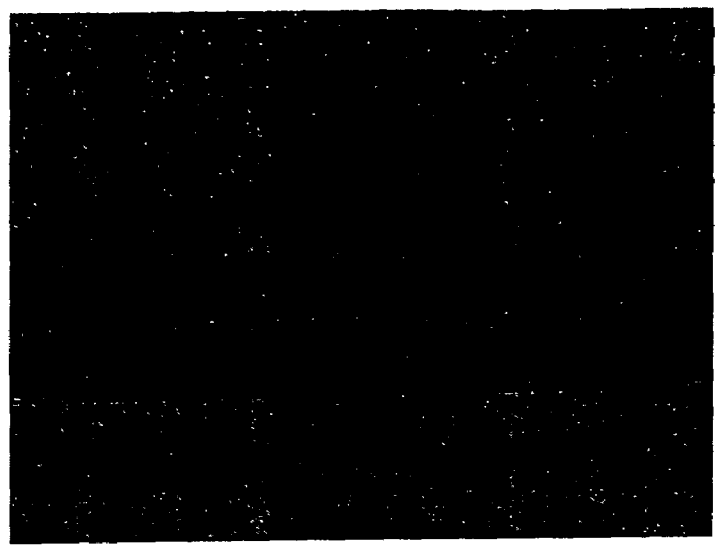
FIGS. 5A and 5B are microscope photographs showing the surfaces of a sample for confirming the effects of a second embodiment and a comparison sample.

As shown in FIG. 5A, tear-off is not observed in the first sample having as a liner the no-bias high density plasma silicon oxide layer. Similar results were obtained for other samples whose silicon nitride layers had thicknesses thinner than 8 nm.

Figure 5B:
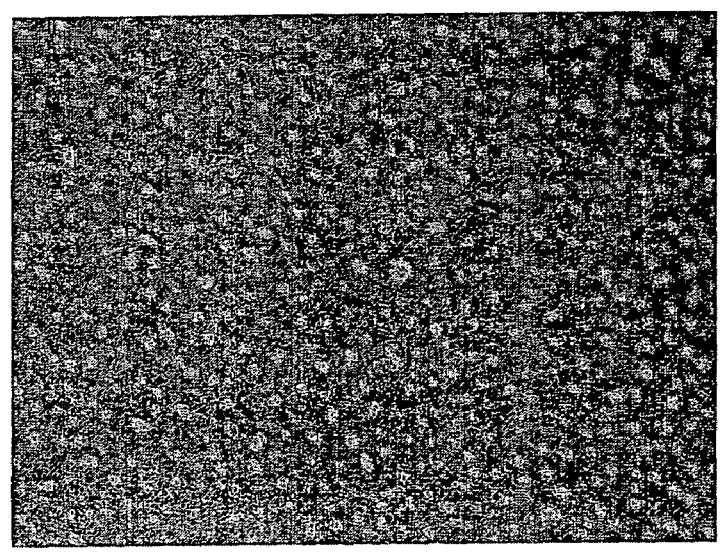

As shown in FIG. 5B, a number of circular tear-off regions were observed in the second sample having a high bias high density plasma silicon oxide layer formed directly on the silicon nitride layer, without forming a no-bias high density silicon oxide layer.

It has been found that tear-off can be prevented even if a silicon nitride layer having a thickness of 8 nm or thinner is used, by dividing HDPCVD for trench burying silicon oxide layer deposition into two steps and by lowering a bias power in the first step.

Tear-off hardly occurs if the silicon nitride layer having a thickness of 8 nm or thinner is used. Even if a silicon nitride layer having a thickness of 8 nm or thicker is used, it is apparent that the influence upon the silicon nitride layer can be reduced by dividing silicon oxide deposition process HDPCVD into two steps.

Pre-heating at 400° C. to 450° C. for 1 to 5 minutes before silicon oxide layer deposition by HDPCVD is effective for preventing tear-off. It can be considered pre-heating is effective for degassing the silicon nitride layer.

Instead of no bias, low bias HDPCVD may be performed. Also in this case, it is preferable to use a bias power sufficiently lower than the bias power at the second step high bias HDPCVD.

Instead of applying a bias power at two steps, the bias power may be increased gradually and continuously from a low bias at the first step to a higher bias power.

Instead of the first step of no-bias HDPCVD, a diode parallel plate plasma CVD system such as shown in FIG. 3B may be used.

In the above embodiments, the liner layer of silicon nitride is deposited by CVD using $SiCl_2H_2$ and $NH_3$ as source gas. Hereinbelow, an embodiment of depositing a liner layer of silicon nitride by CVD using bis-tertial butylaminosilane (BTBAS) and ammonia ($NH_3$), as source gas.

Figure 6C:
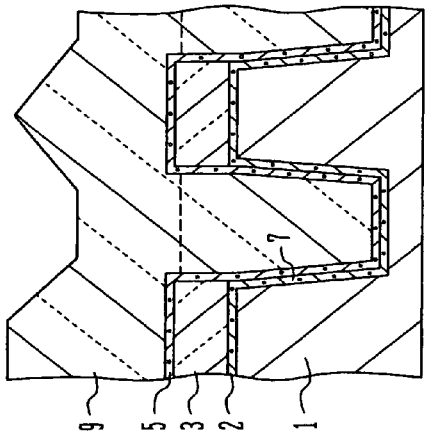
FIGS. 6A to 6D are cross-sectional views of a semiconductor substrate illustrating a further embodiment of the invention.
Figure 6D:
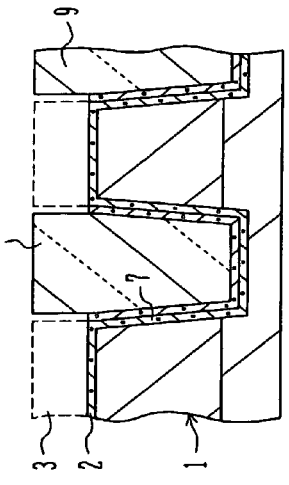
Figure 6A:
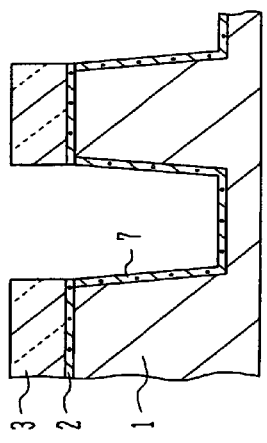

As shown in FIG. 6A, a silicon oxide layer 2, for example of a thickness 10 nm, is formed on the surface of a silicon substrate 1 by thermal oxidation. On the silicon oxide layer 2, a silicon nitride layer 3, for example of a thickness of 100 nm–150 nm, is formed by low pressure chemical vapor deposition (LPCVD) using $SiCl_2H_2$ and $NH_3$, at a substrate temperature of 650° C.

A resist pattern for defining active regions is formed on the silicon nitride layer 3. Reactive ion etching (RIE) is performed for the silicon nitride layer 3, the silicon oxide layer 2 thereunder, and the silicon substrate thereunder, using the resist pattern as an etching mask. The silicon substrate is etched to a depth of about 300 nm, thereby forming isolation trenches.

The surface of silicon substrate exposed at the trenches is thermally oxidized to form a first liner layer 7 of silicon oxide having a thickness of about 2 nm–10 nm, for example a thickness of 5 nm. The processes up to here are similar to those of the foregoing embodiments, and the structure of FIG. 6A is equivalent to that of FIG. 1B.

Figure 6B:
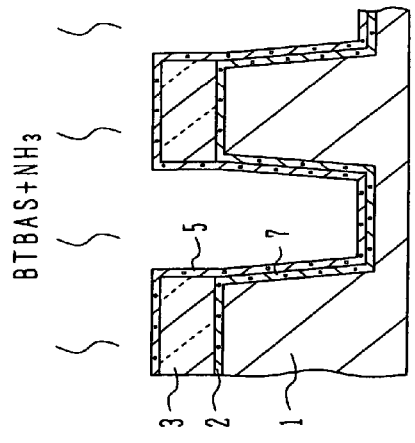

As shown in FIG. 6B, a second liner layer 5 of silicon nitride having a thickness 2 nm–20 nm is formed to cover the silicon nitride layer 3 and the first liner 7 of silicon oxide, by thermal CVD using bis-tertial butylaminosilane (BTBAS) and ammonia ($NH_3$) as source gas.

This thermal CVD is carried out under the conditions of, pressure 1.33 Pa–1330 Pa, for example 65 Pa, substrate temperature 550° C.–580° C., flow rate of BTBAS 5 sccm–200 sccm, for example 40 sccm, flow rate of $NH_3$ 50 sccm–200 sccm for example 160 sccm, flow rate ratio [BTBAS]:[$NH_3$]=1:1–2:20, for example 1:4.

The substrate temperature of 550° C.–580° C. is lower than the substrate temperature of 650° C. in LPCVD using $SiCl_2H_2$ and $NH_3$ as source gas. The resultant silicon nitride contains carbon. After the deposition of the second liner layer 5 of silicon nitride, annealing may be conducted at 1000° C.–1150° C. to strengthen the tensile stress of the second liner layer 5 of silicon nitride.

As shown in FIG. 6C, a silicon oxide layer 9 of a thickness 500 nm on a planar surface is formed on the substrate provided with the second liner layer of silicon nitride, by high density plasma (HDP) CVD, to embed or fill the trenches. After the deposition of the silicon oxide layer 9, annealing at 1000° C.–1150° C. may be conducted.

After the deposition of silicon oxide layer 9, chemical mechanical polishing (CMP) is carried out using the second liner layer 5 of silicon nitride and the silicon nitride layer 3 as CMP stopper. Unnecessary portions of the silicon oxide layer 9 above the silicon nitride layer 3 are removed. The second liner layer 5 of silicon nitride, and upper part of the silicon nitride layer 3 may also be polished away by this CMP. In this way, a shallow trench isolation (STI) is formed.

As shown in FIG. 6D, the silicon nitride layer 3 on the substrate surface is removed by etching using hot phosphoric acid. The second liner layer of silicon nitride formed on the sidewall of the silicon nitride layer 3 is also removed simultaneously. Here, the etching speed of the second liner layer 5 of silicon nitride formed by using BTBAS, is slower than the etching speed of the silicon nitride layer 3 formed by using $SiCl_2H_2$. Therefore, in the etching of hot phosphoric acid for removing the silicon nitride layer 3, the second liner layer 5 of silicon nitride in the trench can be hardly etched relative to the surface of the silicon substrate.

If the second liner layer 5 of silicon nitride in the STI is etched, the gate electrode will cover the shoulder of an active region from above and from a side surface. By the resultant field concentration, a parasitic MOS transistor having a lowered threshold voltage will be generated. By suppressing the etching of the second liner layer, appearance of divot at the shoulder of the active region is prevented. Hence appearance of a parasitic transistor or deterioration of the characteristics of a transistor to be formed thereafter can be suppressed.

Then, similar to the foregoing embodiments, well-known manufacturing steps are performed: the silicon oxide layer 2 is removed by etching of diluted fluoric acid, a sacrificial oxide film is formed and ion implantation for forming wells is performed, implanted impurities are activated, the sacrificial oxide film is removed and a gate insulating film is formed, a gate electrode is formed, ion implantation for forming source/drain regions is performed, and activation of implanted impurities is done. MOS transistors will thus be formed.

The second liner layer 5 of silicon nitride in FIG. 6B is also formed using $SiCl_2H_2$ and $NH_3$ similar to the foregoing embodiments to form comparison samples.

FIGS. 7A and 7B are microscope photographs of upper surface of samples according to comparison example and the above embodiment, and FIG. 7C is a table listing the experimental results of peel-off in both the samples with varied thickness.

FIG. 7A is a photograph of a surface of a comparison sample. The second liner layer 5 of silicon nitride is formed to a thickness of 10 nm using $SiCl_2H_2$ and $NH_3$ as source gas. Many peel-off or tear-off spots are observed in the isolation region.

FIG. 7B is a photograph of a sample according to the above embodiment. The second liner layer 5 of silicon nitride is formed to a thickness of 10 nm using BTBAS and $NH_3$ as source gas. There can be found no peel-off in the isolation region. It will be apparent that the adhesion of the second liner layer 5 of silicon nitride is improved by using BTBAS.

FIG. 7C shows the peel-off results of samples, having the second liner layer 5 of silicon nitride with a varied thickness of 6 nm–20 nm. DCS-SiN represents samples of comparison example in which the second liner layer 5 of silicon nitride is formed by using $SiCl_2H_2$ (DCS) and $NH_3$ as source gas. BTN represents samples according to the embodiment wherein the second liner layer 5 of silicon nitride is formed using BTBAS and $NH_3$ as source gas.

In the comparison example, samples of thickness 6 nm and 20 nm do not have peel-off spots, but samples from thickness 8 nm to thickness 12 nm have many peel-off spots. Whereas in the samples BTN according to the embodiment, no peel-off spot is found in all the samples of thickness 6 nm, 8 nm, 10 nm, 12 nm, and 20 nm.

It was found that peel-off can be prevented by forming the silicon nitride layer using BTBAS as source gas, regardless of the thickness of the silicon nitride layer. The silicon nitride layer formed by using BTBAS, and deposited at a substrate temperature of 550° C.–580° C., contains carbon (C) in its composition. Carbon-containing silicon nitride layer is considered to improve adhesion with silicon oxide layer.

The silicon nitride formed by using BTBAS as source gas has a tensile stress of around 1.5 GPa which is larger than the tensile stress of around 1.2 GPa of silicon nitride formed by using DCS as source gas. A large tensile stress is expected to be effective for canceling the compressive stress of silicon oxide formed by HDP-CVD.

The carbon-containing silicon nitride is not limited to that formed by using BTBAS and ammonia as source gas. It will be possible to form silicon nitride containing carbon, using other organic silicon source gas. It will also be possible to form silicon nitride containing carbon, using silicon source gas and another organic gas. For example, carbon-containing silicon nitride will be realized by forming silicon nitride using hexachlorodisilane ($Si_2Cl_6$, HCD), ethylene ($C_2H_4$) and ammonia as source gas. Also, it will be possible to form silicon nitride containing carbon by forming silicon nitride using a silicon source of disilane ($Si_2H_3$), or dichlorosilane ($SiCl_2H_2$), etc with an additive of ethylene ($C_2H_4$) or monomethylsilane ($CH_3SiH_3$), and nitrogen source gas such as ammonia.

Insulating layers having a low absorption coefficient for ultra-violet rays compared to organic insulating layer (such as SiLK, trademark) having a benzene ring, for example SiOC, were also used as inter-level insullator. When the semiconductor substrate was subjected to a process in which ultra-violet rays were irradiated to the inter-level insulator, there occurred changes in the characteristics of the manufactured p-channel MOS transistors.

FIG. 8A shows a plan structure of a p-channel transistor in a sample manufactured. N-type active region ARn is 160 nm width×640 nm length. A p-type gate electrode G traversing above a central portion of the active region AR has a gate length of 40 nm. P-type source/drain region on both sides of the gate has a length along the current direction of 300 nm. The n-type channel region under the gate electrode is 40 nm gate length×16 nm gate width.

FIG. 8B shows a cross sectional structure of a semiconductor device comprising CMOS transistor configuration. Shallow trench isolation STI defines an n-type active region ARn and a p-type active region ARp. Above the n-type active region ARn and p-type active region ARp, a p-type insulated gate electrode Gp and an n-type insulated gate electrode Gn are formed and are covered with a first inter-level insulating layer IL1. Conductive plugs P are formed through the first inter-level insulating layer IL1 to reach source/drain regions. On the first inter-level insulating layer IL1, a second inter-level insulating layer IL2, a third inter-level insulating layer IL3, a fourth inter-level insulating layer IL4, . . . are laminated. In these inter-level insulating layers, a multi-layer wirings W1, W2, W3, . . . are embedded. At least part of the inter-level insulating layers IL1, IL2, IL3, IL4 is formed of silicon oxide (including SiOC).

FIG. 8C is a graph showing the drain current vs. gate voltage characteristics of the comparison example s1 and embodiment example s2. The p-channel MOS transistor becomes turned on at a negative voltage of a large absolute value, and allows a drain current of the order of $10^{-4}$ A. In the comparison example s1, when the gate voltage (absolute value) is decreased and changed to positive polarity, the drain current does not decrease lower than about $1\times10^{-6}$ A. Namely, a considerable amount of drain leak current is allowed to flow even in the off state. Such a phenomenon is clearly observed in a device having a channel width of 1 micrometer.

Such a leak current is considered to arise from charging of negative charge around the surface of isolation region. Namely, the channel region near the side wall of STI becomes an equivalent state where a negative bias due to the negative charge is applied. Therefore, a region of the active region AR in the vicinity of STI may form a parasitic transistor which is always turned on. When the gate width is decreased, the influence of the parasitic transistor will increase.

In the sample s2 in which the liner layer of silicon nitride is formed using BTBAS as source gas, the characteristics of on state is almost the same as that of sample s1. When the gate voltage is decreased and changed to positive polarity, the drain current continues to be decreased to the order of $1\times10^{-9}$ A. Namely, the off current can be decreased further by three digits, compared to sample s1.

From these results, it can be considered as follows. In the p-channel MOS transistor having the second liner layer of silicon nitride formed by using DCS as source gas, negative charge is easily induced at the silicon nitride layer by ultraviolet ray irradiation, and a parasitic transistor may be generated. In the p-channel MOS transistor having the second liner layer of carbon-containing silicon nitride, parasitic transistor is hardly generated even when ultraviolet rays are irradiated. The turn-off characteristics can be widely improved, especially in a device having a channel width of 1 micrometer or less. Carbon-containing silicon nitride is considered to suppress generation of the negative charge.

In the semiconductor device having an STI provided with the second liner layer of silicon nitride formed by using DCS as source gas, it is considered that the STI will be charged with negative charge upon irradiation of ultra-violet rays. In the n-channel MOS transistor, the parasitic transistor by negative charge will be always turned off. The parasitic transistor will not increase the leak current, but decrease the on current. When the channel width is narrowed, the decrease of the on current may become apparent. The STI formed by using BTBAS as source gas will be effective to prevent deterioration of these transistor characteristics.

The present invention has been described in connection with the preferred embodiments. The invention is not limited

What we claim are:

1. A method of manufacturing a semiconductor device comprising the steps of:
   (a) forming a polishing stopper layer over a surface of a semiconductor substrate;
   (b) forming a trench in said semiconductor substrate by etching said stopper layer and said semiconductor substrate;
   (c) forming a first liner insulating layer of silicon oxide over a surface of said semiconductor substrate exposed in said trench;
   (d) forming a second liner insulating layer of silicon nitride in direct contact with said first liner insulating layer, said second liner insulating layer having a thickness of 20 nm or thicker;
   (e) depositing an isolation layer of silicon oxide by plasma CVD, said isolation layer burying a recess defined by said second liner insulating layer;
   (f) polishing and removing an unnecessary region of said isolation layer by using said stopper layer as a polishing stopper;
   (g) etching said stopper layer; and
   wherein said second liner insulating layer has a tensile stress of 1.2 GPa or larger.

2. The method of manufacturing a semiconductor device according to claim 1, further comprising after said step (d), the step of performing annealing at 1000° C. to 1150° C.

3. The method of manufacturing a semiconductor device according to claim 1, wherein the plasma CVD is high density plasma CVD.

4. The method of manufacturing a semiconductor device according to claim 1, wherein said step (e) comprises:
   (e1) depositing a third liner insulating layer of silicon oxide over said second liner insulating layer by plasma CVD at a first bias; and
   (e2) depositing an isolation layer of silicon oxide by plasma CVD at a second bias higher than the first bias, said isolation layer burying a recess defined by said third liner insulating layer.

5. The method of manufacturing a semiconductor device according to claim 4, wherein the first bias in said step (e1) is no bias.

6. The method of manufacturing a semiconductor device according to claim 4, wherein said step (e1) includes a step of performing pre-heating at 400° C. to 450° C. and a next step of forming said third liner insulating layer of silicon oxide.

7. The method of manufacturing a semiconductor device according to claim 4, wherein said step (e1) deposits said third liner insulating layer of silicon oxide by diode parallel plate plasma CVD.

8. The method of manufacturing a semiconductor device according to claim 4, wherein said step (e2) is executed by using an inductive coupling plasma CVD system.

9. The method of manufacturing a semiconductor device according to claim 1, further comprising said second liner insulating layer having a thickness of greater than 20 nm.

10. The method of manufacturing a semiconductor device according to claim 1, wherein the thickness of said second liner insulating layer is greater than 20 nm.

11. A method of manufacturing a semiconductor device comprising the steps of:
   (a) forming a polishing stopper layer over a surface of a semiconductor substrate;
   (b) forming a trench in said semiconductor substrate by etching said stopper layer and said semiconductor substrate;
   (c) forming a first liner insulating layer of silicon oxide over a surface of said semiconductor substrate exposed in said trench;
   (d) forming a second liner insulating layer of silicon nitride over said first liner insulating layer;
     (e1) depositing a third liner insulating layer of silicon oxide over said second liner insulating layer by plasma CVD at a first bias;
     (e2) depositing an isolation layer of silicon oxide by plasma CVD at a second bias higher than the first bias, said isolation layer burying a recess defined by said third liner insulating layer;
   (f) polishing and removing an unnecessary region of said isolation layer by using said stopper layer as a polishing stopper; and
   (g) etching said stopper layer.

12. The method of manufacturing a semiconductor device according to claim 11, wherein the first bias in said step (e1) is no bias.

13. The method of manufacturing a semiconductor device according to claim 11, wherein said step (e1) includes a step of performing pre-heating at 400° C. to 450° C. and a next step of forming said third liner insulating layer of silicon oxide.

14. The method of manufacturing a semiconductor device according to claim 11, wherein said step (e1) deposits said third liner insulating layer of silicon oxide by diode parallel plate plasma CVD.

15. The method of manufacturing a semiconductor device according to claim 11, wherein said step (e2) is executed by using an inductive coupling plasma CVD system.

16. The method of manufacturing a semiconductor device according to claim 11, further comprising after said step (d), a step of performing annealing at 1000° C. to 1150° C.

17. The method of manufacturing a semiconductor device according to claim 11, wherein said second liner insulating layer has a tensile stress of 1.2 GPa or larger.

18. The method of manufacturing a semiconductor device according to claim 11, wherein the plasma CVD is high density plasma CVD.

19. The method of manufacturing a semiconductor device according to claim 11, wherein the second liner insulating layer has a thickness of 8 nm or thinner.

20. A method of manufacturing a semiconductor device comprising the steps of:
   (a) forming a polishing stopper layer over a surface of a semiconductor substrate;
   (b) forming a trench in said semiconductor substrate by etching said stopper layer and said semiconductor substrate;
   (c) forming a first liner insulating layer of silicon oxide over a surface of said semiconductor substrate exposed in said trench;
   (d) forming a second liner insulating layer of carbon-containing silicon nitride over said first liner insulating layer;
   (e) depositing an isolation layer of silicon oxide by plasma CVD, said isolation layer burying a recess defined by said second liner insulating layer;
   (f) polishing and removing an unnecessary region of said isolation layer by using said stopper layer as a polishing stopper;
   (g) etching said stopper layer; and wherein said second liner layer has a tensile stress larger than 1.2 GPa.

21. The method of manufacturing a semiconductor device according to claim 20, wherein said step (d) deposits the carbon-containing silicon nitride layer by chemical vapor deposition using organic silicon source gas, or a combination of silicon source gas and an organic gas.

22. The method of manufacturing a semiconductor device according to claim 20, wherein said step (g) is carried out under such condition that etching rate for the second liner insulating layer is smaller than etching rate for the silicon nitride layer of said stopper layer.

23. The method of manufacturing a semiconductor device according to claim 20, wherein said step (d) deposits the carbon-containing silicon nitride layer by chemical vapor deposition using bis-tertial butylaminosilane (BTBAS) and ammonia as source gas.

24. The method of manufacturing a semiconductor device according to claim 23, wherein said step (d) is carried out at a substrate temperature of 550° C.–580° C.

25. A semiconductor device comprising:
 a semiconductor substrate;
 a trench formed in said semiconductor substrate, and defining active regions;
 a first liner layer of silicon oxide covering surface of each said trench;
 a second liner layer of carbon-containing silicon nitride formed over said first liner layer;
 an isolation region of silicon oxide formed over said second liner layer and filling said trench;
 a p-channel MOS transistor formed in one of said active regions; and
 wherein said second liner layer has a tensile stress larger than 1.2 GPa.

26. The semiconductor device according to claim 25, wherein said second liner layer does not form a divot relative to surface of the semiconductor substrate.

27. The semiconductor device according to claim 25, further comprising an n-channel MOS transistor formed in another of said active regions, forming CMOS configuration with said p-channel MOS transistor.

28. The semiconductor device according to claim 25, further comprising:
 interlevel insulating layers covering said CMOS configuration, and having low UV absorption coefficient;
 multi-layer wiring formed in said interlevel insulating layers.

29. The semiconductor device according to claim 25, wherein said source gas is BTBAS.

30. A semiconductor device comprising:
 a semiconductor substrate;
 a trench formed in said semiconductor substrate, and defining active regions;
 a first liner layer of silicon oxide covering surface of each said trench;
 a second liner layer of silicon nitride formed over said first liner layer by using a source gas which leaves carbon in product silicon nitride;
 an isolation region of silicon oxide formed over said second liner layer and filling said trench;
 a p-channel MOS transistor formed in one of said active regions; and
 wherein said second liner layer has a tensile stress larger than 1.2 GPa.

31. The semiconductor device according to claim 30, wherein said second liner layer does not form a divot relative to surface of the semiconductor substrate.

32. The semiconductor device according to claim 30, further comprising an n-channel MOS transistor formed in another of said active regions, forming CMOS configuration with said p-channel MOS transistor.

33. The semiconductor device according to claim 30, further comprising:
 interlevel insulating layers covering said CMOS configuration, and having low UV absorption coefficient;
 multi-layer wiring formed in said interlevel insulating layers.

* * * * *